United States Patent
Kinugasa

(10) Patent No.: US 6,512,261 B2
(45) Date of Patent: Jan. 28, 2003

(54) METHOD OF FABRICATING A SEMICONDUCTOR DEVICE AND THE SEMICONDUCTOR DEVICE WITH A CAPACITOR STRUCTURE HAVING INCREASED CAPACITANCE

(75) Inventor: Akinori Kinugasa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/855,536

(22) Filed: May 16, 2001

(65) Prior Publication Data

US 2002/0079532 A1 Jun. 27, 2002

(30) Foreign Application Priority Data

Dec. 21, 2000 (JP) .......................... 2000-388791

(51) Int. Cl.[7] ............................................. H01L 27/108
(52) U.S. Cl. ....................... 257/309; 257/306; 438/255; 438/398; 438/665; 438/964
(58) Field of Search ................................ 257/309, 306, 257/529; 438/40, 255, 398, 665, 964

(56) References Cited

U.S. PATENT DOCUMENTS 4,375,125 A * 3/1983 Byatt ........................... 29/588
5,696,017 A * 12/1997 Ueno ........................... 437/60
5,936,296 A * 8/1999 Park et al. .................... 257/529
6,010,931 A * 1/2000 Sun et al. ..................... 438/240
6,188,097 B1 * 2/2001 Derderian et al. ........... 257/306
6,228,702 B1 * 5/2001 Hirota ......................... 438/240

* cited by examiner

Primary Examiner—Hoai Ho
Assistant Examiner—Tu-Tu Ho
(74) Attorney, Agent, or Firm—McDermott, Will & Emery

(57) ABSTRACT

A method of producing a semiconductor memory having a memory cell structure in which a storage node, which consists of a capacitor electrode film having a rugged surface formed inside holes of an interlayer insulating film that is deposited on a substrate, constitutes a capacitor together with a cell plate through a dielectric film. In a method of forming holes in the interlayer insulating film in the direction of its thickness, forming the capacitor electrode inside the holes and over the upper surface of the interlayer insulating film, removing the capacitor electrode film exposed to the upper surface of the interlayer insulating film, making the surface of the capacitor electrode film formed inside the holes a rugged surface, and forming a cell plate inside the holes and on the upper surface of the interlayer insulating film, the capacitor electrode film exposed to the upper surface of the interlayer insulating film is removed before the surface of the capacitor electrode film formed inside the holes is made to be a rugged surface.

4 Claims, 5 Drawing Sheets

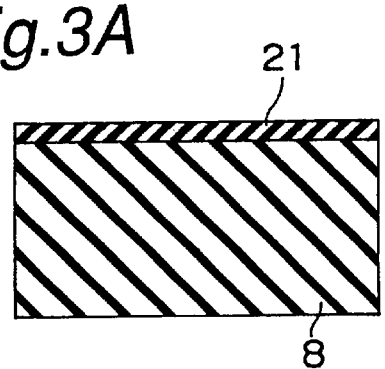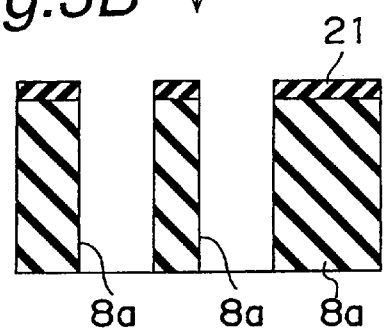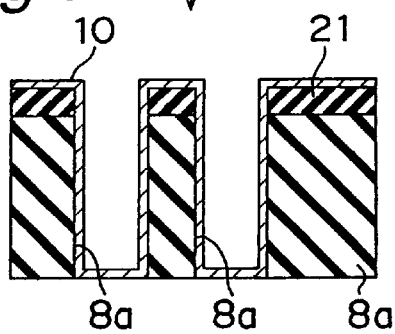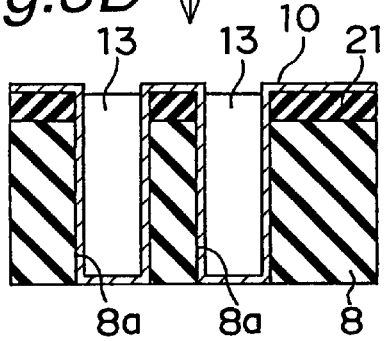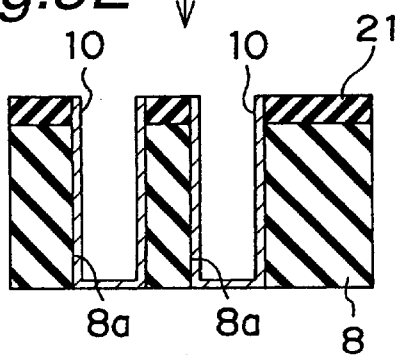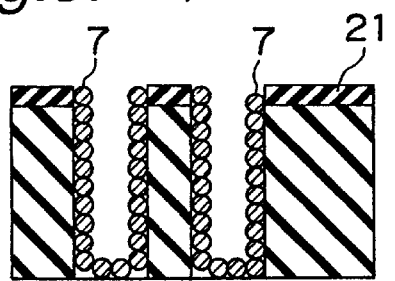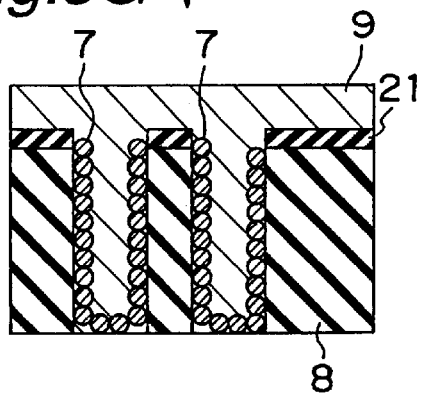

METHOD OF FABRICATING A SEMICONDUCTOR DEVICE AND THE SEMICONDUCTOR DEVICE WITH A CAPACITOR STRUCTURE HAVING INCREASED CAPACITANCE

BACKGROUND OF THE INVENTION

The present invention relates to a semiconductor memory and a method of producing the same, wherein the semiconductor memory has a storage node that constitutes a capacitor together with a cell plate, and that consists of a capacitor electrode film having a rugged surface, for improving the capacitance of the capacitor.

Of recent years, as portable equipment such as cellular phones and notebook computers becomes smaller and lighter, various semiconductor memories that are built in the equipment are desired to have fine structure and large-scale integration. In particular, DRAM (Dynamic Random Access Memory) is representative one of such memories, and for their fine structure and large-scale integration, it is necessary to compress their memory cell structure and reduce the area per bit occupied by memory cells. On the other hand, it is required to keep the capacitance of the capacitors more than a predetermined value to store information on each memory cell. Recently, as a technology for coping with this problem, rugged surface processing that roughens the surface of the storage node to enlarge the surface area, which constitutes the capacitor with a cell plate through a dielectric film, has been often used.

As a method of producing DRAM having a storage node that consists of a capacitor electrode film having a rugged surface, it is known, for example, to remove part of the capacitor electrode film by etching, after rugged surface processing, to isolate and insulate the capacitor electrode film. In such a method, part of the capacitor electrode film to be removed sometimes remains in etching, since the thickness of the capacitor electrode after rugged surface processing is not uniform. In some cases, the remnants of the capacitor electrode film cause a shortcut between the storage node and cell plate to produce a bit defect of the memory.

SUMMARY OF THE INVENTION

The object of the present invention is to provide a semiconductor memory having a memory cell structure and a method of producing the same such that part of the capacitor electrode film therein is securely removed to reduce the percentage of defective memories.

In an aspect of the present invention, there is provided a method of producing a semiconductor memory having a memory cell structure in which a storage node, which consists of a capacitor electrode film having a rugged surface formed inside holes of an interlayer insulating film that is deposited on a substrate, constitutes a capacitor together with a cell plate through a dielectric film, the method comprising steps of; forming holes in the interlayer insulating film in the direction of its thickness, forming the capacitor electrode inside the holes and over the upper surface of the interlayer insulating film, removing the capacitor electrode film exposed to the upper surface of the interlayer insulating film, making the surface of the capacitor electrode film formed inside the holes a rugged surface, and forming a cell plate inside the holes and on the upper surface of the interlayer insulating film, wherein the step of removing the capacitor electrode film exposed to the upper surface of the interlayer insulating film is performed before the step of making the surface of the capacitor electrode film formed inside the holes a rugged surface. The method may further comprise a step of forming a protecting layer having a predetermined or more amount of moisture resistance over the whole upper surface of the interlayer insulating film, before the step of forming the holes in the interlayer insulating film. A layer consisting of SiN may be used for the protecting layer. The cell plate and protecting layer that are formed over the circuits in the peripheral area of the memory cell structure may be simultaneously removed after the step of forming the cell plate.

In an another aspect of the present invention, there is provided a method of producing a semiconductor memory having a memory cell structure in which a storage node, which consists of a capacitor electrode film having a rugged surface formed inside holes of an interlayer insulating film that is deposited on a substrate, constitutes a capacitor together with a cell plate through a dielectric film, the method comprises steps of; forming a protecting layer having a predetermined or more amount of moisture resistance over the interlayer insulating film, forming holes in the interlayer insulating film in the direction of its thickness, forming the capacitor electrode film inside the holes and over the upper surface of the protecting layer formed over the interlayer insulating film, making the surface of the capacitor electrode film formed inside the holes a rugged surface, a step of removing the rugged capacitor electrode film exposed to the upper surface of the interlayer insulating film, and forming a cell plate inside the holes and on the upper surface of the interlayer insulating film, wherein the step of removing the capacitor electrode film exposed to the upper surface of the interlayer insulating film is performed before the step of making the surface of the capacitor electrode film formed inside the holes a rugged surface.

In a further another aspect of the present invention, there is provided a semiconductor memory having a memory cell structure in which a storage node, which consists of a capacitor electrode film having a rugged surface formed inside holes of an interlayer insulating film that is deposited on a substrate, constitutes a capacitor together with a cell plate through a dielectric film, wherein a protecting layer having a predetermined or more amount of moisture resistance is formed over the upper surface of the interlayer insulating film.

BRIEF DESCRIPTION OF THE DRAWINGS

Other objects and attainments together with a fuller understanding of the invention will become apparent and appreciated by referring to the following description and claims taken in conjunction with the accompanying drawings, in which like parts are designated by like reference numerals and in which:

FIGS. 3A through 3G are explanatory drawings that show the production flow for the capacitor of a semiconductor memory in accordance with a second embodiment of the present invention;

DESCRIPTION OF THE PREFERRED EMBODIMENTS

In the following are described some embodiments of the present invention with reference to the attached figures.

First Embodiment

Figure 1:
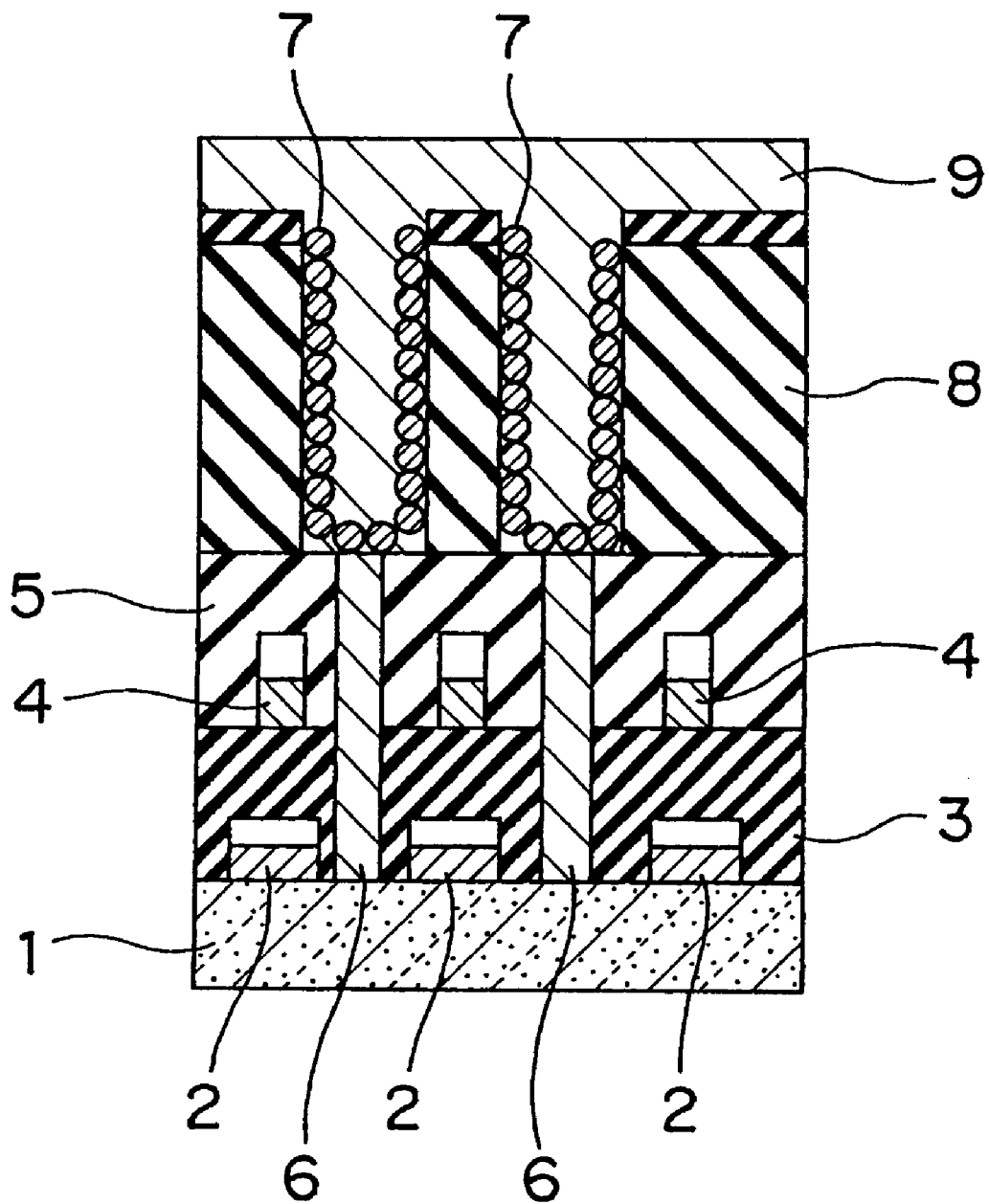
FIG. 1 is a vertical cross-sectional view that schematically shows the memory cell structure of a common semiconductor memory.

FIG. 1 is a vertical cross-sectional view that schematically shows the memory cell structure of a DRAM in accordance with a first embodiment of the present invention. In FIG. 1, the numeral 1 denotes a Si substrate, 2 denotes a word line, 3 denotes a first interlayer insulating film, 4 denotes a bit line, 5 denotes a second interlayer insulating film, 6 denotes a storage node contact, 7 denotes a storage node as a capacitor electrode, 8 denotes a third interlayer insulating film, and 9 denotes a cell plate. Also, though not included in the figure, a capacitor dielectric film is formed over the upper surface of the third interlayer insulating film. In such DRAM memory cell structure, the storage node, capacitor dielectric film, and cell plate constitute a capacitor that charges electrons for signals responsible for memory.

A method of producing the capacitor of a semiconductor memory in accordance with a first embodiment of the present invention is now described in reference with FIGS. 2A through 2G. In FIGS. 2A through 2G, the second interlayer insulating film and the structure beneath it is omitted.

Figure 2A:
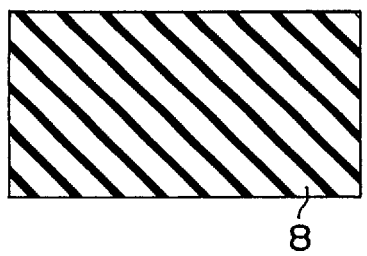
FIGS. 2A through 2G are explanatory drawings that show the production flow for the capacitor of a semiconductor memory in accordance with a first embodiment of the present invention.

First, as shown in FIG. 2A, after the storage node contact 6 is formed (see FIG. 1), the third interlayer insulating film 8 is deposited over the second interlayer insulating film 5. For the material of this third interlayer insulating film 8, TEOS (Tetra Ethyl Ortho Silicate) or BPTEOS (Boro Phospho Tetra Ethyl Ortho Silicate: TEOS-$O_3$ BPSG film) is used.

Figure 2B:
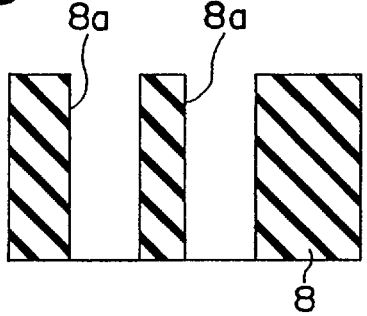

Next, etching is performed by photolithography for forming the storage node. By this etching, through holes 8a that are through from the upper surface to the lower surface of the third interlayer insulating film 8 in the direction of its thickness are formed, as shown in FIG. 2B. As seen from FIG. 1, these through holes 8a are formed in order that part of the upper surface of the second interlayer insulating film 5, including the end face of the storage node contact 6, is exposed through the through holes 8a.

Figure 2C:
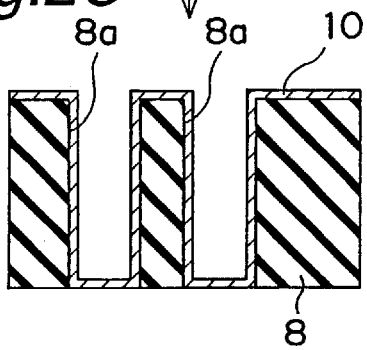

Next, as shown in FIG. 2C, the capacitor electrode film 10 is formed over the third interlayer insulating film 8 by using polysilicon or amorphous silicon for example. In this case, the capacitor electrode film 10 is also formed on the internal surface of the through holes 8a formed in the third interlayer insulating film 8 and on the upper surface of the second interlayer insulating film 5 exposed through the through holes 8a.

Figure 2D:
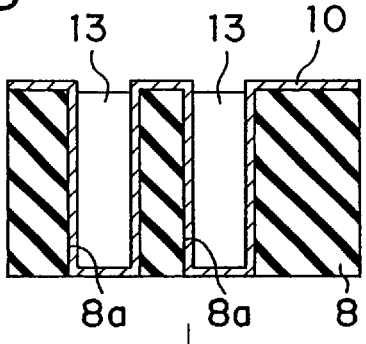

Further, a protecting material 13 that can be removed after photoresist/SOG processing and the like is buried in the through holes 8a having the capacitor electrode film 10 formed therein. By this means, the capacitor electrode film 10 is exposed only on the upper surface and its neighborhood of the third interlayer insulating film 8, as shown in FIG. 2D.

Figure 2E:
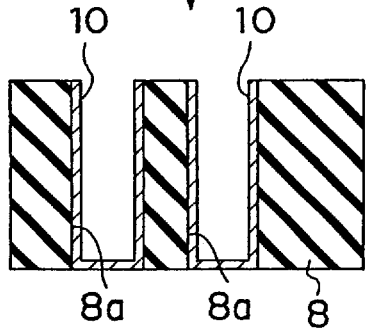

Still further, in order to isolate and insulate the capacitor electrode film 10, the capacitor electrode film 10 formed on the upper surface of the third interlayer insulating film 8 is removed by etching. When the protecting material 13 that has protected the capacitor electrode film 10 formed inside the through holes 8a including part of the upper surface of the second interlayer insulating film 5 is removed, a capacitor electrode 10 as shown in FIG. 2E is obtained.

Figure 2F:
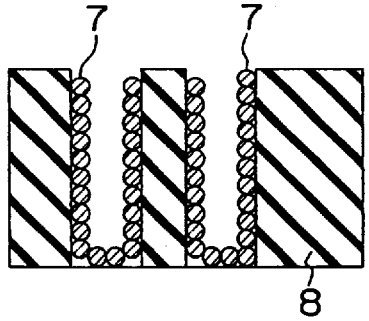

Further, rugged surface processing is performed for the capacitor electrode film 10. Then, if necessary, the shape of the capacitor electrode film 10 is adjusted by etching or the like processing. Then, injection, annealing, and the like are performed to make the capacitor electrode 10 an electrode. By the processing described so far, a storage node 7 as shown in FIG. 2F is completely fabricated.

In Figs which are referred to concerning the embodiments of the present invention, in order to schematically show the change brought by rugged surface processing, the capacitor electrode 10 obtained after rugged surface processing is made to be the storage node 7 and illustrated by small circles.

Figure 2G:
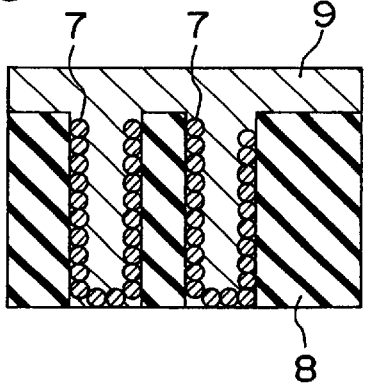

Then, after the capacitor dielectric film (not shown in the figure) is formed over the third interlayer insulating film 8 by using an ON film (laminated film of $SiO_2$ and $Si_3N_4$) or a $Ta_2O_5$ film, a cell plate 9 is formed inside the through holes 8a having the storage node 7 and over the capacitor dielectric film by using polysilicon. In the processing described so far, a capacitor of the DRAM memory cell structure shown in FIG. 2G is obtained.

In the present first embodiment, etching for isolating and insulating the capacitor electrode film 10 is performed, before the rugged surface processing of the capacitor electrode 10 (see FIG. 2F), so that the film thickness of the object is uniform. Therefore, uniform and sound etching can be made possible. As a result, the remnants of the capacitor electrode 10 that cause a shortcut between the storage node 7 and cell plate 9 can be a repressed. Thus, the percentage of defective memories can be reduced and the productivity of the product can be improved.

In the following is described another embodiment of the present invention. In the following description, the same components as in the first embodiment are denoted by the same numerals, and their explanations are omitted.

Second Embodiment

If etching is performed before rugged surface processing, the third interlayer insulating film 8 is more frequently exposed on its upper surface to the outside influence such as moisture and the like than in the case where etching is performed after rugged surface processing as in conventional methods. Therefore, there is some apprehension about a setback on the third interlayer insulating layer 8. Therefore, in order to cope with this problem, a protecting film that has a comparatively higher moisture resistance is formed beforehand over the third interlayer insulating film 8.

Referring to FIGS. 3A through 3G, a method of producing the capacitor of a DRAM memory cell structure in accordance with the second embodiment of the present invention is described now. First, after the storage contact 6 (see FIG. 1) is formed, the third interlayer insulating film 8 is deposited over the second interlayer insulating film 5, by using TEOS or BPTEOS for example.

Further, over this insulating layer, a protecting film 21 having a comparatively higher moisture resistance is formed, as shown in FIG. 3A. A SiN protecting film (silicon nitride film) is used for this protecting film.

Next, etching is performed by photolithography for forming the storage node. By this etching, through holes 8a that are through from the upper surface to the lower surface of the third interlayer insulating film 8 in the direction of its thickness are formed, as shown in FIG. 3B. As seen from FIG. 1, these through holes 8a are formed in order that part of the upper surface of the second interlayer insulating film 5, including the end face of the storage node contact 6, is exposed through the through holes 8a.

Next, as shown in FIG. 3C, the capacitor electrode film 10 is formed over the third interlayer insulating film 8 by using polysilicon or amorphous silicon for example. In this case, the capacitor electrode film 10 is also 5 formed on the internal surface of the through holes 8a formed in the third interlayer insulating film 8 and on the upper surface of the second interlayer insulating film 5 exposed through the through holes 8a.

Further, a protecting material 13 that can be removed after photoresist/SOG processing and the like is buried in the through holes 8a having the capacitor electrode film 10 formed therein. By this means, the capacitor electrode film 10 is exposed only on the upper surface and its neighborhood of the third interlayer insulating film 8, as shown in FIG. 3D.

Still further, in order to isolate and insulate the capacitor electrode film 10, the capacitor electrode film 10 exposed to the upper surface of the third interlayer insulating film 8 is removed by etching. When the protecting material 13 that has protected the capacitor electrode film 10 formed inside the through holes 8a including part of the upper surface of the second interlayer insulating film 5 is removed, a capacitor electrode 10 as shown in FIG. 3E is obtained.

Further, rugged surface processing is performed for the capacitor electrode film 10. Then, if necessary, the shape of the capacitor electrode film 10 is adjusted by etching or the like processing. Then, injection, annealing, and the like are performed to make the capacitor electrode 10 an electrode. By the processing described so far, a storage node 7 as shown in FIG. 3F is completely fabricated.

Also, in the second embodiment, the SiN protecting film 21 is formed over the third interlayer insulating film 8, so that further dry etching can be performed after the rugged surface processing. This dry etching securely removes foreign materials in the rugged surface of the storage node 7 and the remaining capacitor electrode on the third interlayer insulating film 8.

Then, after the capacitor dielectric film (not shown in the figure) is formed over the SiN protecting film 21 by using an ON film (laminated film of $SiO_2$ and $Si_3N_4$) or a $Ta_2O_5$ film, a cell plate 9 is formed inside the through holes 8a having the storage node 7 and over the SiN protecting film 21 by using polysilicon. In the processing described so far, a capacitor of the DRAM memory cell structure shown in FIG. 3G is obtained.

In the present second embodiment, the SiN protecting film 21 of comparatively high moisture resistance is formed over the third interlayer insulating film 8, before the capacitor electrode 10 is formed. Therefore, the upper surface of the third interlayer insulating film 8 is not exposed to the outside conditions such as moisture during proceeding processing. In this way, the third interlayer insulating film 8 is protected from the outside influence and a setback caused thereby is prevented.

Figure 4A:
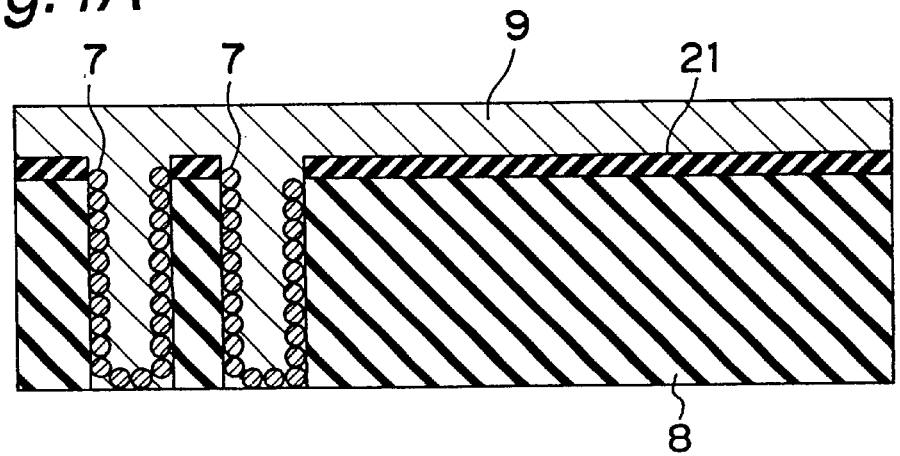
FIGS. 4A through 4C are explanatory drawings that show the production flow for removing part of the cell plate and SiN protecting film following the production flow of FIGS. 3A through 3G.
Figure 4B:
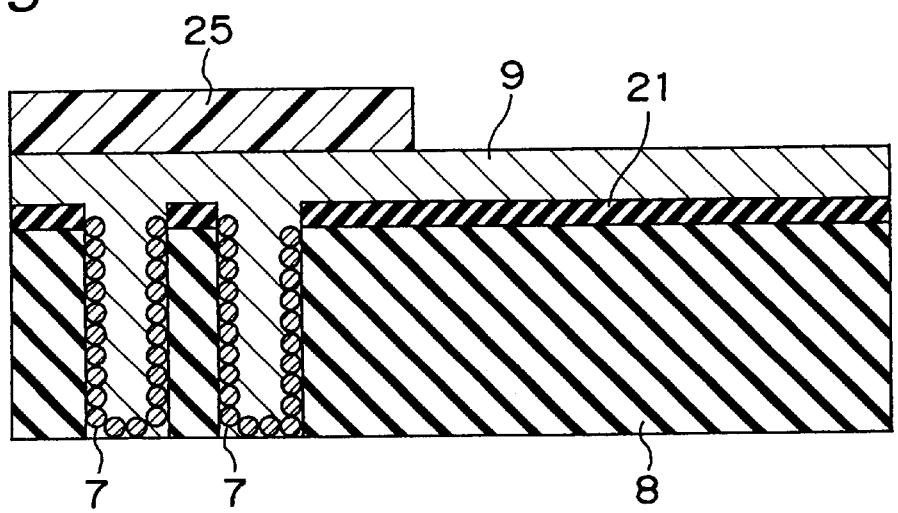
Figure 4C:
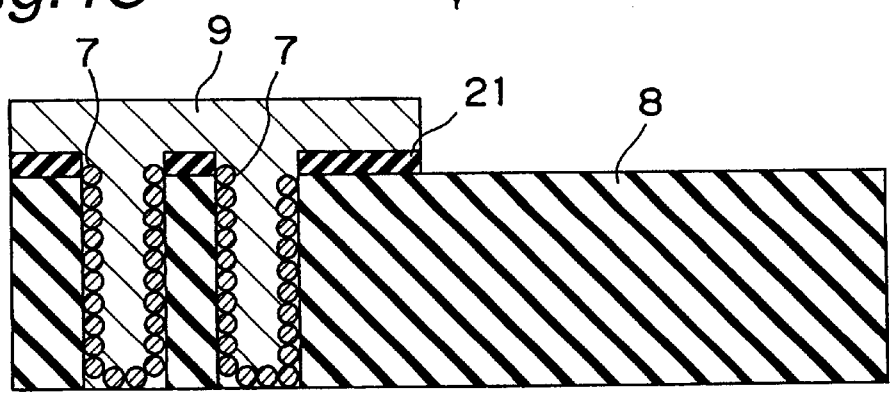

Next, a method of removing the cell plate 9 and SiN protecting film 21 that have been formed on the peripheral circuits of the memory cell structure with reference to FIGS. 3A through 3G. is described. FIGS. 4A through 4C are explanatory drawings that show the production flow for eliminating part of the cell plate and SiN protecting film following the production flow of FIG. 3A through 3G. In the step shown in FIG. 4A, the cell plate 9 and SiN protecting film 21 cover the whole upper surface of the third interlayer insulating film 8. In order to remove the cell plate 9 and SiN protecting film 21 that are formed on the peripheral circuits of the memory cell structure, an etching protecting film 25 is formed on the upper side of the memory cell structure by photolithography, as shown in FIG. 4B. Then, the parts of both the cell plate 9 and SiN protecting film 21 that are not protected by the etching protecting film 25 are simultaneously removed. So far, the cell plate 9 and SiN protecting film 21 that are formed on the peripheral circuits of the memory cell structure are removed. In this way, the apprehension about the possibility that the cell plate 9 and SiN protecting film 21 affect the etching for forming the contacts with the metal of the peripheral circuits is eliminated.

Third Embodiment

Referring to FIGS. 5A through 5G, a method of producing the capacitor of a DRAM memory cell structure in accordance with the third embodiment of the present invention is described now. In this third embodiment, the SiN protecting film 21 is formed over the third interlayer insulating film 8 as in the second embodiment. However, the production is performed in the previously known order of the production process, that is, etching is performed after the rugged surface processing of the capacitor electrode 10.

Figure 5A:
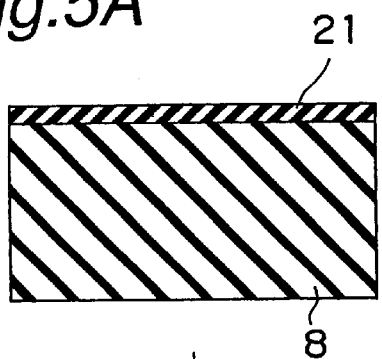
FIGS. 5A through 5G are explanatory drawings that show the production flow for the capacitor of a semiconductor memory in accordance with a third embodiment of the present invention.
Figure 5B:
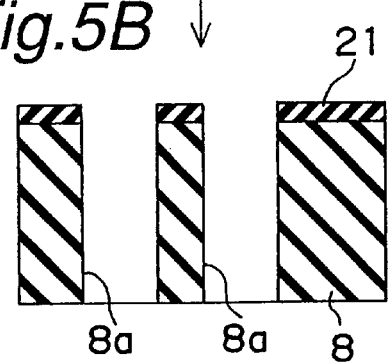

First, after the storage contact 6 (see FIG. 1) is formed, the third interlayer insulating film 8 is deposited over the second interlayer insulating film 5, by using TEOS or BPTEOS for example. Further, over this insulating layer 8, a SiN protecting film 21 having a comparatively higher moisture resistance is formed. Next, etching is performed by photolithography for forming the storage node. By this etching, through holes 8a that are through from the upper surface to the lower surface of the third interlayer insulating film 8 in the direction of its thickness are formed, as shown in FIG. 5B. As seen from FIG. 1, these through holes 8a are formed in order that part of the upper surface of the second interlayer insulating film 5, including the end face of the storage node contact 6, is exposed through the through holes 8a.

Figure 5C:
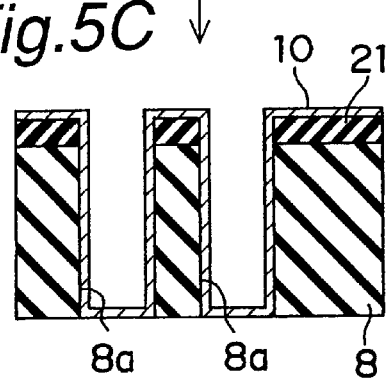

Next, as shown in FIG. 5C, the capacitor electrode film 10 is formed over the third interlayer insulating film 8 by using polysilicon or amorphous silicon for example. In this case, the capacitor electrode film 10 is also formed on the internal surface of the through holes 8a formed in the third interlayer insulating film 8 and on the upper surface of the second interlayer insulating film 5 exposed through the through holes 8a.

Figure 5D:
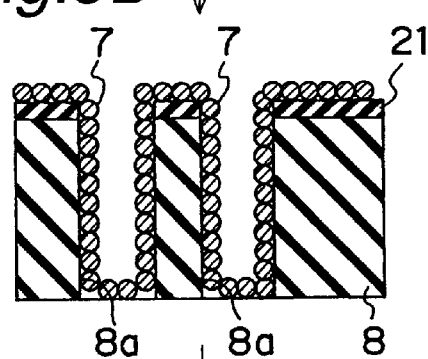

Further, in order to increase the capacitance of the capacitor, rugged surface processing is performed on the capacitor electrode film 10, and the storage node 7 as shown in FIG. 5D is obtained.

Figure 5E:
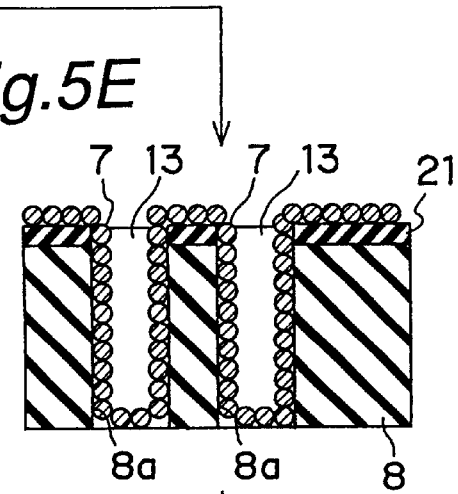

After that, a protecting material 13 that can be removed after photoresist/SOG processing and the like is buried in the through holes 8a having the storage node 7 formed therein. By this means, the storage node 7 is exposed only on the upper surface and its neighborhood of the third interlayer insulating film 8, as shown in FIG. 5E.

Figure 5F:
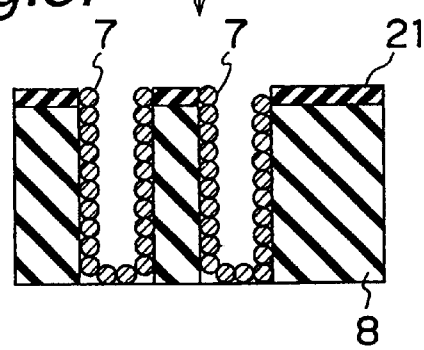

Still further, in order to isolate and insulate the storage node 7, the storage node exposed to the upper surface of the third interlayer insulating film 8 is removed by etching. In this third embodiment, the SiN protecting film 21 is formed beforehand over the third interlayer insulating film 8. Therefore, the amount of etching can be set great on such a level as to leave no storage node 7 during the etching, so that the storage node 7 exposed to the upper surface of the interlayer insulating film 8 can be securely removed. When the protecting material 13 that has protected the storage node 7 formed inside the through holes 8a including part of the upper surface of the second interlayer insulating film 5 is removed, a storage node 7 as shown in FIG. 5F. is obtained. Then, if necessary, the shape of the storage node 7 is adjusted by etching or the like processing. Then, injection, annealing, and the like are performed to make the storage 7 an electrode.

Figure 5G:
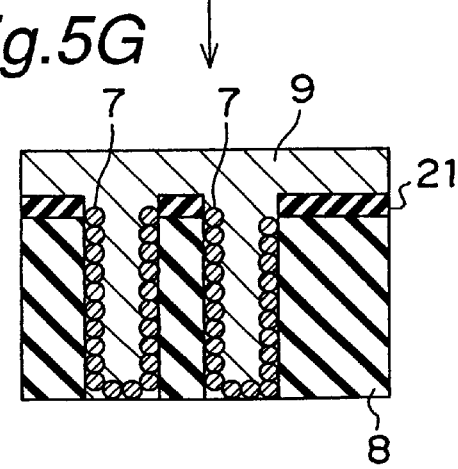

Then, after the capacitor dielectric film (not shown in the figure) is formed over the SiN protecting film 21 by using an ON film (laminated film of $SiO_2$ and $Si_3N_4$) or a $Ta_2O_5$ film, a cell plate 9 is formed inside the through holes 8a having the storage node 7 and over the SiN protecting film 21 by using polysilicon. In the processing described so far, a capacitor of the DRAM memory cell structure shown in FIG. 5G is obtained.

In the present third embodiment, etching is performed, after the rugged surface processing as in previously known methods. However, the SiN protecting film 21 is formed beforehand over the upper surface of the interlayer insulating film 8. Therefore, during the etching for removing the storage node 7 exposed to the upper surface of the third interlayer insulating film 8, the amount of etching can be set great on such a level as to leave no storage node 7 of irregular thickness. In this way, the storage node 7 exposed to the upper surface of the third interlayer insulating film 8 can be securely removed. As a result, the percentage of defective memories can be reduced and the productivity of the product can be improved.

Finally, it is obvious that the present invention is not limited to the embodiments described above, and various kinds of modifications and changes in designing may be possible without departing from the scope of the present invention.

What is claimed is:

1. A method of producing a semiconductor memory having a memory cell structure in which a storage node, which consists of a capacitor electrode film having a rugged surface formed inside holes of an interlayer insulating film that is deposited on a substrate, constitutes a capacitor together with a cell plate through a dielectric film, said method comprising steps of:
    forming holes in said interlayer insulating film in the direction of its thickness,
    forming said capacitor electrode inside said holes and over the upper surface of said interlayer insulating film,
    removing the capacitor electrode film exposed to the upper surface of said interlayer insulating film,
    making the surface of said capacitor electrode film formed inside said holes a rugged surface, and
    forming a cell plate inside said holes and on the upper surface of said interlayer insulating film,
    wherein said step of removing the capacitor electrode film exposed to the upper surface of the interlayer insulating film is performed before said step of making the surface of the capacitor electrode film formed inside the holes a rugged surface.

2. The method of producing a semiconductor memory according to claim 1, further comprising a step of forming a protecting layer having a predetermined or more amount of moisture resistance over the whole upper surface of said interlayer insulating film, before said step of forming the holes in the interlayer insulating film.

3. The method of producing a semiconductor memory according to claim 2, wherein a layer consisting of SiN is used for said protecting layer.

4. The method of producing a semiconductor memory according to claim 2, wherein said cell plate and protecting layer that are formed over the circuits in the peripheral area of the memory cell structure are simultaneously removed after said step of forming the cell plate.

* * * * *